(12) United States Patent
Menard

(10) Patent No.: US 10,453,835 B2
(45) Date of Patent: *Oct. 22, 2019

(54) POWER COMPONENT PROTECTED AGAINST OVERHEATING

(71) Applicant: STMicroelectronics (Tours) SAS, Tours (FR)

(72) Inventor: Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/055,635

(22) Filed: Aug. 6, 2018

(65) Prior Publication Data

US 2018/0350793 A1    Dec. 6, 2018

Related U.S. Application Data

(63) Continuation of application No. 15/243,552, filed on Aug. 22, 2016, now Pat. No. 10,069,001.

(30) Foreign Application Priority Data

Mar. 31, 2016    (FR) ...................... 16 52822

(51) Int. Cl.
*H01L 29/66* (2006.01)
*H01L 21/332* (2006.01)
(Continued)

(52) U.S. Cl.
CPC ...... *H01L 27/0248* (2013.01); *H01L 29/7404* (2013.01); *H01L 29/747* (2013.01);
(Continued)

(58) Field of Classification Search
CPC ............. H01L 29/747; H01L 29/41716; H01L 29/42308; H01L 29/7404; H01L 27/0248; H01L 29/7416; H01L 29/87
See application file for complete search history.

(56) References Cited

U.S. PATENT DOCUMENTS 4,982,261 A    1/1991  Takanashi
8,901,601 B2   12/2014 Menard et al.
(Continued)

FOREIGN PATENT DOCUMENTS

EP    1544919 A1    6/2005
FR    2974447 A1   10/2012
JP    S59215773 A  12/1984

OTHER PUBLICATIONS

EPO Search Report and Written Opinion for EP 16184603.5 dated Mar. 30, 2017 (10 pages).

*Primary Examiner* — Alonzo Chambliss
(74) *Attorney, Agent, or Firm* — Crowe & Dunlevy

(57) ABSTRACT

A triac has a vertical structure formed from a silicon substrate having an upper surface side. A main metallization on the upper surface side has a first portion resting on a first region of a first conductivity type formed in a layer of a second conductivity type. A second portion of the main metallization rests on a portion of the layer. A gate metallization on the upper surface side rests on a second region of the first conductivity type formed in the layer in the vicinity of the first region. A porous silicon bar formed in the layer at the upper surface side has a first end in contact with the gate metallization and a second end in contact with the main metallization.

11 Claims, 4 Drawing Sheets

(51) Int. Cl.
*H01L 27/02* (2006.01)
*H01L 29/74* (2006.01)
*H01L 29/747* (2006.01)
*H01L 29/87* (2006.01)
*H01L 29/417* (2006.01)
*H01L 29/423* (2006.01)

(52) U.S. Cl.
CPC .......... *H01L 29/7416* (2013.01); *H01L 29/87* (2013.01); *H01L 29/41716* (2013.01); *H01L 29/42308* (2013.01)

(56) References Cited

U.S. PATENT DOCUMENTS

| | | |
|---|---|---|
| 8,994,065 B2 | 3/2015 | Menard et al. |
| 10,069,001 B2 * | 9/2018 | Menard ............... H01L 29/7404 |
| 2012/0250200 A1 | 10/2012 | Ham et al. |
| 2013/0228822 A1 | 9/2013 | Menard et al. |
| 2013/0320395 A1 | 12/2013 | Menard et al. |
| 2015/0084094 A1 | 3/2015 | Menard |
| 2015/0108537 A1 | 4/2015 | Menard et al. |
| 2016/0118485 A1 | 4/2016 | Menard et al. |

* cited by examiner

POWER COMPONENT PROTECTED AGAINST OVERHEATING

CROSS-REFERENCE TO RELATED APPLICATION

This application is a continuation of United States Application for patent Ser. No. 15/243,552 filed Aug. 22, 2016, which claims the priority benefit of French Application for Patent No. 1652822, filed Mar. 31, 2016, the disclosures of which is hereby incorporated by reference in their entireties to the maximum extent allowable by law.

TECHNICAL FIELD

The present disclosure relates to power components protected against overheating, and more particularly to triacs and thyristors having a vertical structure, protected against temperature increases.

BACKGROUND

Triacs and thyristors with a vertical structure are electronic power switches comprising a stack of at least four layers and/or semiconductor regions of alternated conductivity types. In such components, a first metallization or main electrode A1 rests on a main surface of the stack. A second metallization or main electrode A2 rests on the other main surface of the stack. A metallization or gate electrode G rests on the same surface of the stack as main electrode A1.

Generally, when a potential difference is present between main electrodes A1 and A2 of one of these components, the flowing of an electric current between main electrodes A1 and A2 is conditioned by the application of a gate current on the gate electrode. Once the current flow has been established between the main electrodes, these components keep on conducting the current until it passes under a threshold value, called the hold current.

FIG. 1 corresponds to FIG. 7 of United States Patent Application Publication No. 2015/0108537 (incorporated by reference). This drawing is a cross-section view of an example of a triac 1 having a vertical structure.

Triac 1 is formed from a lightly-doped N-type silicon substrate 3 (N⁻). The upper and lower surfaces of substrate 3 comprise P-type doped layers 5 and 7. Upper layer 5 contains a heavily-doped N-type region 9 ($N^+$) and a heavily-doped N-type region 11 ($N^+$). Lower layer 7 contains a heavily-doped N-type region 13 ($N^+$) in an area substantially complementary to that occupied, in top view, by region 9. A main electrode A1 is arranged on the upper surface of substrate 3, astride $N^+$ region 9 and a portion of P-type doped layer 5. A main electrode A2 is arranged on the lower surface of substrate 3, astride $N^+$ region 13 and a portion of P-type doped layer 7. A gate electrode G is arranged on the upper surface of substrate 3, astride $N^+$ region 11 and a portion of P-type doped layer 5.

When triac 1 is in the off state and a gate signal is applied to terminal G, a gate current IGK flows through P layer 5 between terminals G and A1, P layer 5 forming a resistor RGK between the terminals. If gate current IGK is greater, in absolute value, than the turn-on threshold of triac 1, voltage drop VGK between terminals G and A1 is sufficient to turn on triac 1, which switches from the off state to the on state.

A disadvantage of triac 1 is that, when its temperature increases, the resistivity of P layer 5, and thus the value of equivalent resistance RGK, increases. Thus, the flowing of a current IGK between terminals G and A1, even if this current is smaller than the normal turn-on current, may cause a high voltage drop in P layer 5, causing a parasitic turning-on of triac 1. Such a parasitic starting contributes to increasing the triac temperature up to a high value capable of causing a degradation, or even a destruction, of the triac. The same problem is posed with thyristors.

FIG. 2 corresponds to FIG. 3(a) of United States Patent Application Publication No. 2012/0250200 (incorporated by reference). This drawing is the electric circuit diagram of an example of protection of a triac 20 against overheating.

Triac 20 comprises main terminals A1 and A2, and a gate terminal G. A Shockley diode 30 is connected between terminal G and terminal A1 of triac 20. Shockley diode 30 is thermally linked to triac 20.

In operation, Shockley diode 30 is initially in the off state and triac 20 operates normally. When triac 20 is overheating, the temperature of the Shockley diode increases and its turn-on threshold decreases. Thus, when a gate signal is applied to terminal G, this signal is deviated through the Shockley diode. As a result, no current flows through resistor RGK shorted by the Shockley diode, and triac 20 remains in the off state. This enables to avoid for the triac temperature to continue increasing, thus preventing its degradation or its destruction.

The protection described in relation with FIG. 2 is relatively difficult to implement and to adjust and is further relatively bulky.

It would thus be desirable to have triacs and thyristors comprising a protection against overheating overcoming at least certain disadvantages of existing protections.

SUMMARY

An embodiment provides a triac having a vertical structure comprising, on the upper surface side of a silicon substrate: a main metallization having a first portion resting on a first region of a first conductivity type formed in a layer of the second conductivity type, and having a second portion resting on a portion of said layer; a gate metallization resting on a second region of the first conductivity type formed in said layer, in the vicinity of the first region; and at least one porous silicon bar formed in said layer, a first end of said bar being in contact with the gate metallization, and the second end of said bar being in contact with the main metallization.

According to an embodiment, the gate metallization is in electric contact with the second region and said at least one bar only.

According to an embodiment, the triac comprises a first porous silicon bar having its second end in contact with said first portion of the main metallization, and a second porous silicon bar having its second end in contact with said second portion of the main metallization.

According to an embodiment, the triac comprises a bar having a first portion extending in said first region and having a second portion extending in said portion of said layer.

Another embodiment provides a thyristor having a vertical structure, comprising, on the upper surface side of a silicon substrate: a main metallization resting on a first region of a first conductivity type formed in a layer of the second conductivity type; a gate metallization resting on a second region made of porous silicon or of doped silicon of the first conductivity type formed in said layer, in the vicinity of said first region; and at least one porous silicon bar formed in said layer, a first end of said bar being in contact with the gate metallization, and the second end of said bar being in contact with the main metallization.

According to an embodiment, between its first and second ends, the bar comprises a portion extending in said first region.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
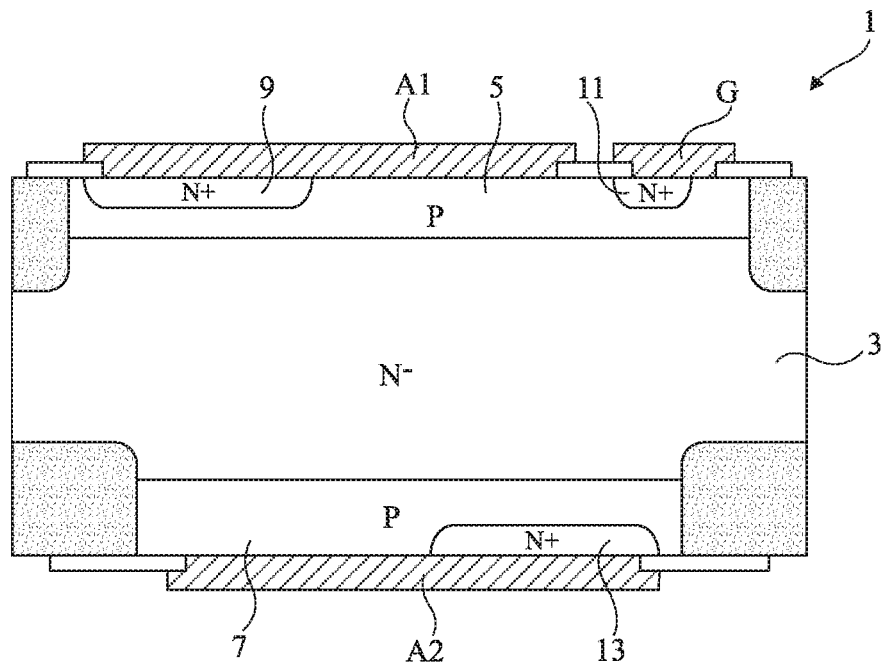
FIG. 1, previously described, corresponds to FIG. 7 of Publication No. 2015/0108537.

The same elements have been designated with the same reference numerals in the various drawings and, further, the various drawings are not to scale.

In the following description, terms "right-hand", "upper", "lower", etc. refer to the orientation of the concerned elements in the corresponding drawings. Unless otherwise mentioned, expressions "arranged on" and "resting on" means arranged on and in contact with" and "resting on and in contact with".

Figure 3A:
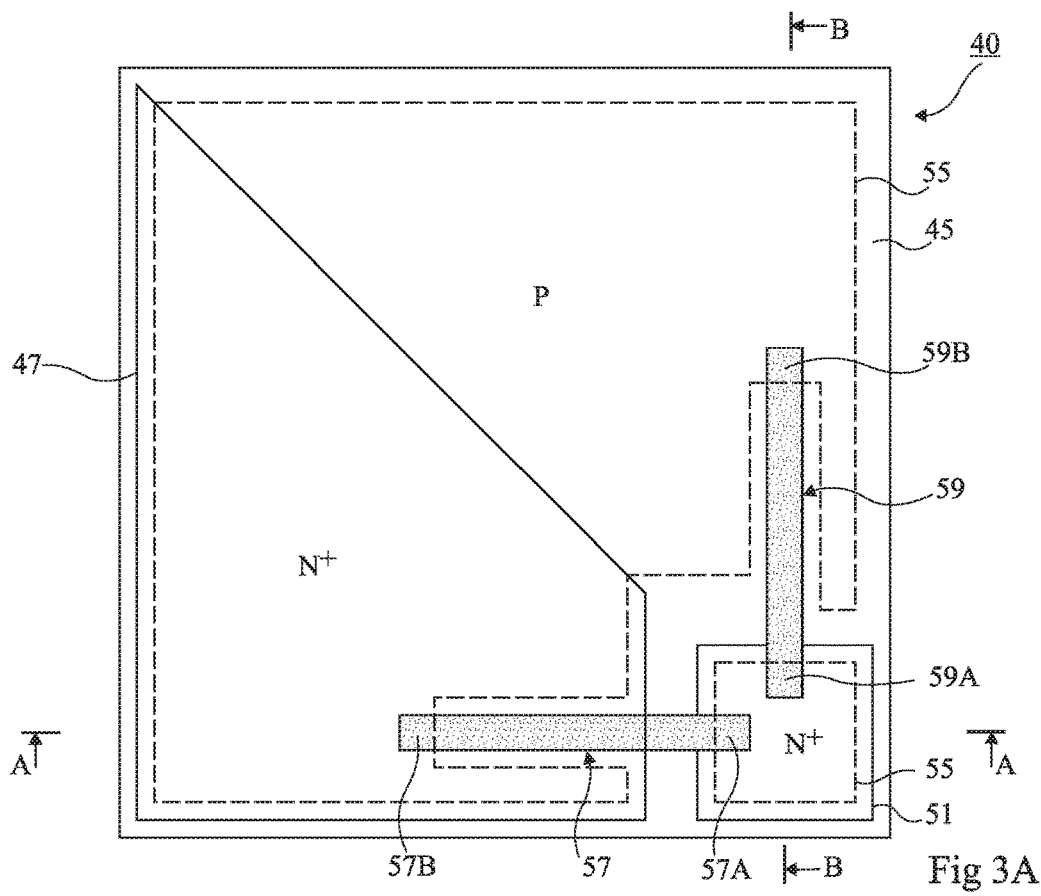
FIGS. 3A to 3C schematically show an embodiment of a triac protected against temperature increases.
Figure 3B:
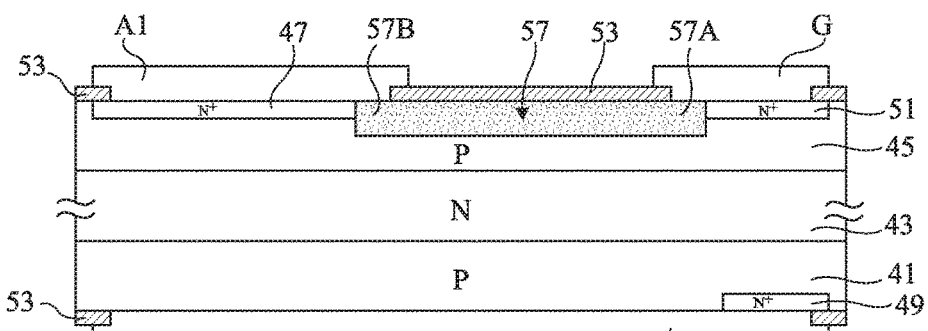
Figure 3C:
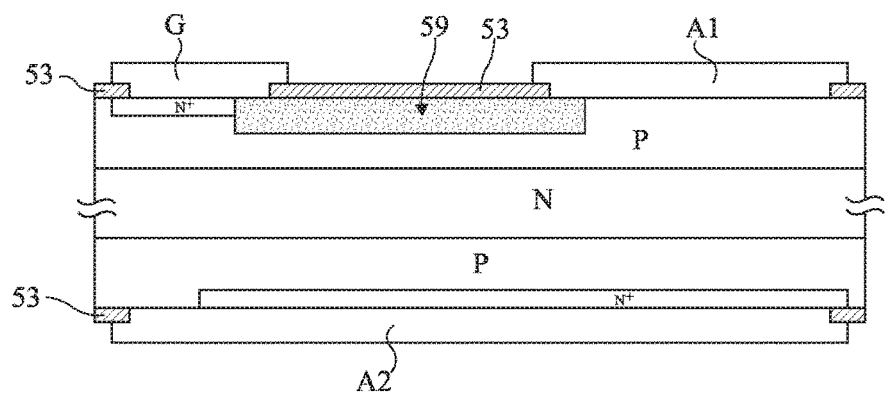

FIGS. 3A, 3B, and 3C schematically show an embodiment of a triac 40 protected against overheating, FIG. 3A being a top view and FIGS. 3B and 3C being cross-section views along respective planes AA and BB of FIG. 3A.

Triac 40 comprises silicon layers 41, 43, and 45 of alternated conductivity types, respectively PNP, respectively corresponding to layer 7, to substrate 3, and to layer 5 of triac 1 described in relation with FIG. 1. A heavily-doped N-type silicon region 47 ($N^+$) is formed in upper P layer 45 and a heavily-doped N-type silicon region 49 ($N^+$) is formed in lower P layer 41. In a corner of triac 40, a heavily-doped N-type silicon region 51 ($N^+$) is formed in upper P layer 45 in the vicinity of $N^+$ region 47. In this embodiment, $N^+$ region 51 has, in top view, a square shape. Further, $N^+$ region 47 has, in top view, the shape of a triangle comprising a cut angle (on the right-hand side of FIG. 3A) and opposite $N^+$ region 51. Although this is not shown in FIGS. 3A to 3C, $N^+$ region 49 occupies an area substantially complementary, in top view, to that occupied by $N^+$ region 47.

A main upper metallization A1 rests on the upper surface of the stack of layers and/or regions 41, 43, 45, 47, 49, and 51, astride $N^+$ region 47 and upper P layer 45. A main metallization A2 rests on the lower surface of the stack, astride $N^+$ region 49 and lower P layer 41. A gate metallization G rests on N+ region 51. Insulating layers 53 are arranged on the upper and lower surfaces of the stack, and delimit the surfaces of electric contact between metallizations A1, A2, and G on the one hand, and the semiconductor regions and/or layers of the stack on the other hand. The electric contact surfaces are delimited by dotted lines 55 in FIG. 3A.

Triac 40 further comprises two bars 57 and 59 made of porous silicon formed in P layer 45. One end 57A of bar 57 is arranged in $N^+$ region 51, in contact with gate metallization G, the other end 57B of bar 57 being arranged in $N^+$ region 47, in contact with main metallization A1. One end 59A of bar 59 is arranged in $N^+$ region 51, in contact with gate metallization G. The other end 59B of bar 59 is arranged in a portion of P layer 45 having a portion of metallization A1 resting thereon, end 59B of the bar being in contact with this portion of metallization A1. Between their ends, bars 57 and 59 are covered with upper insulating layer 53. Thus, although a portion of bar 57 extends in $N^+$ region 51 and a portion of bar 59 extends in the portion of the P layer coated with metallization A1, these portions of bars 57 and 59 are not in electric contact with metallization A1. Further, gate metallization G is only in electric contact with $N^+$ region 51 and ends 57A and 59A of bars 57 and 59.

The case where a potential difference is applied between terminals A1 and A2 is considered. If a positive or negative gate current IGK greater (in absolute value) than the turn-on current of triac 40 flows between terminals G and A1, current IGK essentially flows through porous silicon bars 57 and 59, which form a resistor RGK between terminals G and A1. For low temperatures, resistance RGK is high, whereby voltage VGK between terminals G and A1 is sufficient to turn on triac 40. However, when triac 40 is overheating, resistance RGK decreases, whereby voltage VGK between terminals G and A1 is no longer sufficient to turn on triac 40, which remains in the off state.

The provision of porous silicon bars 57 and 59 between electrodes G and A1 thus enables to avoid for triac 40 to become conductive as soon as it overheats.

It should be understood that, in the same way as the doping levels and the dimensions of the different semiconductor regions of triac 40 are selected according to desired turn-on conditions, the porosity and the dimensions of bars 57 and 59 are also selected so that triac 40 no longer turns on above a given temperature threshold. For a given temperature threshold, the porosity and the dimensions of bars 57 and 59 can be determined by means of simulation tools currently used by those skilled in the art. The forming of a porous silicon region, for example, a bar, in a doped semiconductor layer is for example described in Publication No. 2015/0108537.

Figure 2:
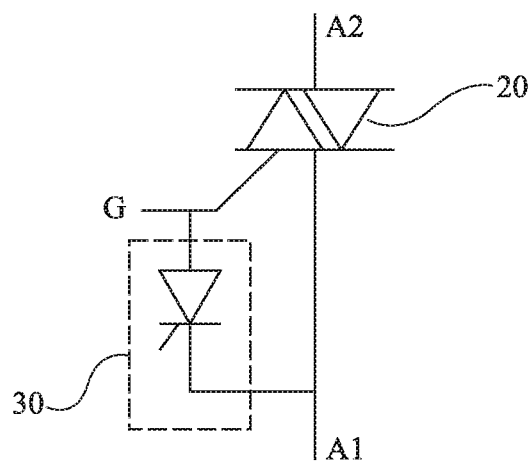
FIG. 2, previously described, corresponds to FIG. 3(a) of Publication No. 2012/0250200.

Advantageously, bars 57 and 59 have a low bulk, and preferably extend at closest to the areas of triac 40 submitted to the strongest temperature increases. Further, conversely to the case where the protection against overheating is performed by a Shockley diode as shown in FIG. 2, bars 57 and 59 enable to protect triac 40 against overheating whatever the operating quadrant thereof.

Triac 40 described hereabove may be seen as two thyristors assembled in antiparallel, a first thyristor comprising layers 47, 45, 43, and 41, and a second thyristor comprising layers 49, 41, 43, and 45. Bar 57 is more sensitive to overheating of the first thyristor and bar 59 is more sensitive to overheating of the second thyristor. The protection against overheating described hereabove thus advantageously enables to take into account temperature increases occurring in one or the other of the thyristors forming triac 40.

Figure 4:
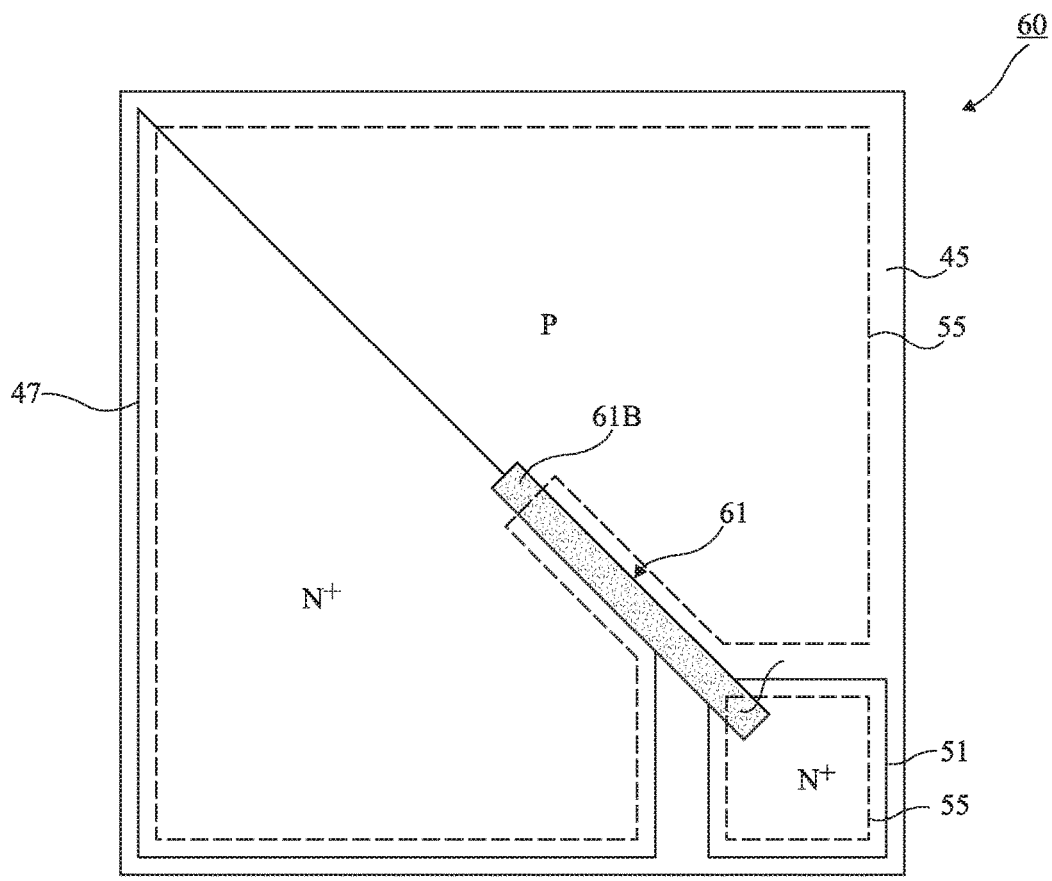
FIG. 4 schematically shows an alternative embodiment of the triac of FIGS. 3A to 3C.

FIG. 4 is a top view of an alternative embodiment of the triac of FIGS. 3A to 3C.

Triac 60 of FIG. 4 comprises same elements as triac 40 of FIGS. 3A to 3C, with the difference that porous silicon bars 57 and 59 are replaced with a single porous silicon bar 61. One end 61A of bar 61 is arranged in $N^+$ region 51, in contact with gate metallization G. The other end 61B of the bar is arranged in P layer 45, in contact with metallization A1. Between its ends 61A and 61B, the bar comprises a portion extending in P layer 45 and N⁺ region 47. Approximately a first half of this portion of bar 61 extends in P layer 45, and approximately the second half of this portion of bar 61 extends in N⁺ region 47. Between ends 61A and 61B, the bar is coated with insulating layer 53. Thus, the portion of bar 61 extending in the P layer and in N⁺ region 47 is not in electric contact with metallization A1. In triac 40 of FIG. 4, gate metallization G is only in electric contact with N⁺ region 51 and end 61A of bar 61.

Advantageously, end 61B of bar 61 is arranged in a substantially central area of the triac, that is, in the area most representative of the triac temperature.

Figure 5A:
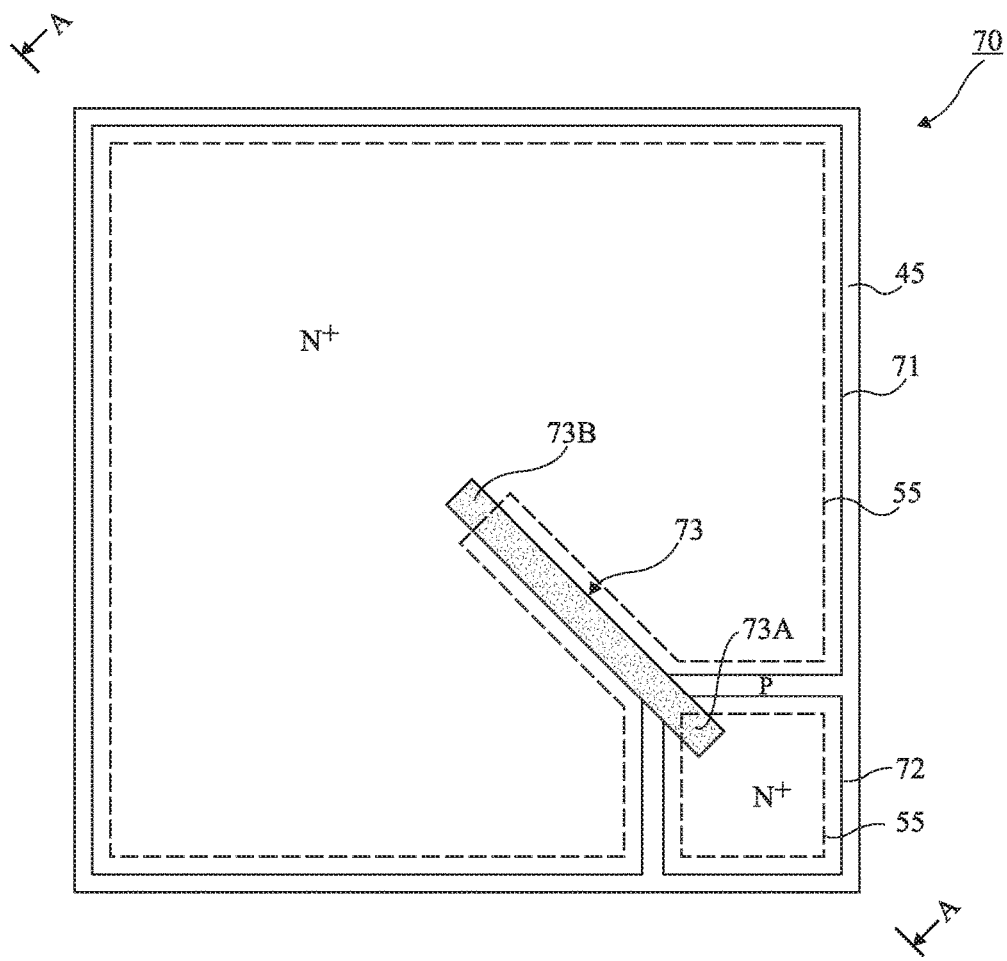
FIGS. 5A and 5B schematically show an embodiment of a thyristor protected against temperature increases.
Figure 5B:
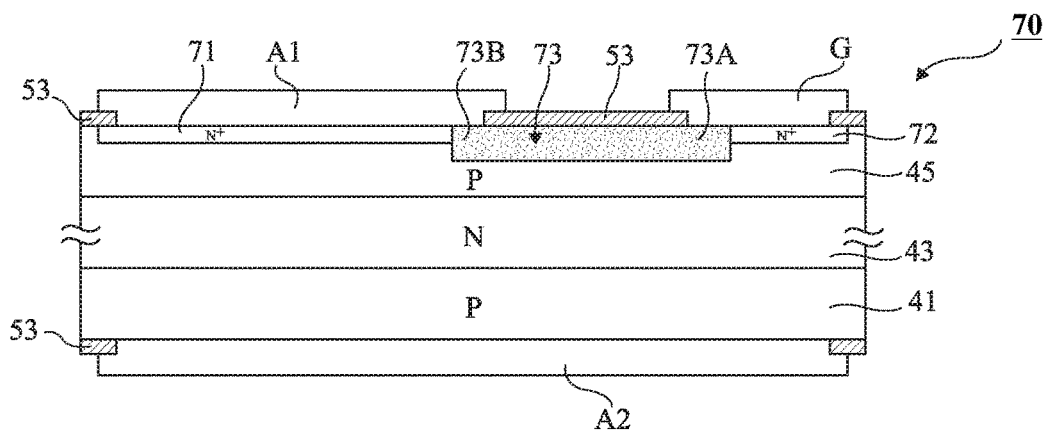

FIGS. 5A and 5B schematically show an embodiment of a thyristor 70 protected against temperature increases, FIG. 5A being a top view and FIG. 5B being a cross-section view along plane AA of FIG. 5A.

Thyristor 70 comprises silicon layers 41, 43, and 45 having alternated conductivity types, respectively PN⁻P. A heavily-doped N-type silicon region 71 (NT⁺) is formed in a main portion of upper P layer 45. In top view, N⁺ region 71 for example has a substantially square shape. A main upper metallization A1 rests on N⁺ region 71, a main lower metallization A2 rests on lower P layer 41. In a corner of the thyristor, a gate metallization G rests on a heavily-doped N-type region 72 (N⁺) formed in upper P layer 45. It should be noted that in such a configuration, the thyristor can be turned on both by a positive and negative gate current, which is not true for conventional thyristors where only the positive turning-on is possible. As a variation, region 72 may be made of porous silicon rather than of heavily-doped N-type silicon (N⁺). In this embodiment, insulating layers 53 are arranged on the upper and lower surfaces of the stack, and delimit the surfaces of electric contact between metallizations A1, A2, and G, on the one hand, and the semiconductor regions and/or layers of the stack, on the other hand. The electric contact surfaces are delimited by dotted lines 55 in FIG. 5A.

A porous silicon bar 73 is formed in layer 45. One end 73A of bar 73 is arranged under metallization G and is in contact therewith. The other end 73B of bar 73 is arranged under metallization A1 and is in contact therewith. Between its ends 73A and 73B, bar 73 is coated with insulating layer 53. Thus, although, between its ends 73A and 73B, bar 73 comprises a portion extending in N⁺ region 71, this portion is not in electric contact with metallization A1. Further, gate metallization G is only in electric contact with region 72 and end 73A of bar 73.

In operation, similarly to what has been described for the triacs of FIGS. 3A to 4, when a gate current IGK flows between terminals G and A1, this current essentially flows through bar 73, which forms a resistor RGK between these terminals. For normal operating temperatures, equivalent resistor RGK has a high value. Thus, when current IGK is greater than the normal thyristor turn-on current, voltage drop VGK between metallizations G and A1 is sufficient to turn on the thyristor. However, when the thyristor is overheating, resistance RGK decreases, whereby voltage drop VGK between metallizations G and A1 is no longer sufficient to turn on the thyristor, which remains in the off state.

Advantageously, end 73B of bar 73 is arranged in a substantially central area of N⁺ region 71, that is, in the thyristor area submitted to the strongest temperature increases.

In the same way as for the previously-described triacs 40, the way in which bar 73 is arranged in thyristor 70 may be modified by those skilled in the art, so that the bar is at closest to the thyristor areas submitted to the strongest temperature increases. It may also be provided to arrange more than one porous silicon bar in the thyristor to be sensitive to temperature increases occurring in different areas of the thyristor.

As an example, the resistivity at 25° C. of the porous silicon of bars 57, 59, 61, and 73 is selected in a range from $10^3$ to $10^4$ ohm·cm. Further, in a technological process enabling to form integrated power components such as previously described with silicon, the thicknesses of the different layers and/or regions will be:

from 5 to 20 µm, for example, 10 µm, for regions 47, 49, 51, and 71, from 10 to 50 µm, for example, 35 µm, for layers 41 and 45, from 10 to 25 µm, for example, 15 µm, for bars 57, 59, 61, and 73; and from 50 to 200 µm, for example, 100 µm, for layer 43.

The doping concentrations will for example be:

in the range from $10^{14}$ to $10^{15}$ at./cm³ for lightly-doped N-type layer 43 (N⁻), in the order of $10^{20}$ at./cm³ for heavily-doped N-type regions 47, 49, 51, and 71 (N⁺), and in the range from $5.10^{17}$ to $5.10^{18}$ at./cm³ for P-type doped layers 41 and 45.

More generally, in relative terms, the thickness of bars 57, 59, 61, and 73 is for example in the range from 0.5 to 1 time the thickness of layer 45.

Specific embodiments have been described. Various alterations, modifications, and improvements will occur to those skilled in the art. In particular, although specific shapes have been described for regions 47, 49, 51, 71, and 73 and for metallizations G, A1, and A2, it should be understood that these shapes may be modified. For example, in thyristor 70 of FIGS. 5A and 5B, N⁺ region 71 may be interrupted by emitter short-circuits, that is, regions where the material of P layer 45 comes into contact with metallization A1. Although a specific arrangement of the gate metallization with respect to main metallization A1 has been described, the above-described embodiments may be adapted to other arrangements of metallizations G and A1, for example, to structures having a central gate.

The foregoing description is illustrated using rectilinear bars. However, it will be understood that the bars may be curved or wavy.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
   a semiconductor substrate having an upper surface side and a lower surface side and including a stack of layers comprising: a first layer doped with a first conductivity type, a second layer doped with a second conductivity type and a third layer doped with the first conductivity type;
   a first metallization on the upper surface side and having a first portion resting on a first doped region of the second conductivity type formed in said third layer;
   a gate metallization on the upper surface side and resting on a second doped region of the second conductivity type formed in said third layer;

a porous silicon bar formed in said third layer, wherein a first end of said porous silicon bar is in contact with the first doped region and the first metallization and wherein a second end of said porous silicon bar is in contact with the second doped region and the gate metallization; and a second metallization on the lower surface side.

2. The integrated circuit of claim 1, wherein the gate metallization is in electric contact with only the second doped region and said porous silicon bar.

3. The integrated circuit of claim 1, wherein said second doped region is also made of porous silicon material.

4. The integrated circuit of claim 1, wherein the first metallization further comprises a second portion resting on a portion of said third layer.

5. The integrated circuit of claim 1, further comprising a third doped region of the second conductivity type formed in said first layer and wherein the second metallization is in contact with the third doped region.

6. The integrated circuit of claim 1, further comprising a fourth doped region of the first conductivity type formed in said third layer and wherein the first metallization is in contact with the fourth doped region.

7. The integrated circuit of claim 6, wherein the first end of said porous silicon bar is in contact with the fourth doped region.

8. An integrated circuit, comprising:
a silicon substrate having an upper surface side and a plurality of layers of alternating conductivity type;
a first metallization on said upper surface side and resting on a first region doped with a first conductivity type formed in a layer of said plurality of layer;
a gate metallization on said upper surface side and resting on a porous silicon region doped with the first conductivity type and formed in said layer, wherein said first doped region is separated from the porous silicon region by a portion of said layer; and
a porous silicon bar formed in said layer and having a first end in contact with the gate metallization and a second end in contact with the main metallization.

9. The integrated circuit of claim 8, wherein, between said first and second ends, the porous silicon bar comprises a portion extending in said first region.

10. The integrated circuit of claim 8, wherein the first end of the porous silicon bar is in contact with the first region and wherein the second end of the porous silicon bar is in contact with the porous silicon region.

11. The integrated circuit of claim 8, wherein the silicon substrate has a lower surface side and further comprising a second metallization on said lower surface side.

* * * * *